United States Patent [19]

Nishiura et al.

[11] Patent Number: 4,692,345

[45] Date of Patent: Sep. 8, 1987

[54] METHOD FOR GETTERING HEAVY METAL FROM A SILICON PLATE

[75] Inventors: Masaharu Nishiura, Yokosuka; Hiromu Haruki, Yokohama, both of Japan

[73] Assignee: Fuji Electric Corporate Research and Devel., Ltd., Japan

[21] Appl. No.: 868,153

[22] Filed: May 20, 1986

Related U.S. Application Data

[63] Continuation of Ser. No. 649,524, Sep. 11, 1984, abandoned.

[30] Foreign Application Priority Data

Dec. 1, 1983 [JP] Japan ................... 58-227663

[51] Int. Cl.$^4$ ........................................... B05D 3/06
[52] U.S. Cl. ........................................ 427/39; 427/376.2
[58] Field of Search ............................. 427/39, 376.2

[56] References Cited

U.S. PATENT DOCUMENTS 3,021,198  2/1962  Rummel ............................... 427/51
4,053,335 10/1977  Hu ..................................... 427/86 X
4,249,962  2/1981  Celler ................................. 148/1.5
4,474,625 10/1984  Cohen et al. ....................... 148/1.5

Primary Examiner—Bernard D. Pianalto
Attorney, Agent, or Firm—Brumbaugh, Graves, Donohue & Raymond

[57] ABSTRACT

In the particular embodiments of the invention disclosed in the specification, a single crystal silicon plate having heavy metal impurities is coated with a layer of amorphous silicon several hundred to several thousand Angstroms thick in a vacuum vessel by a glow discharge at a pressure of 1 to 10 Torr and a temperature of about 200° C. Silane gas is used to form a non-doped layer and about 1% of diborane or phosphine gas may be added to form a p-type or an n-type layer, respectively. The glow discharge is produced by a high frequency voltage applied to electrodes in the vacuum vessel but a direct current discharge may be used initially to provide improved adhesion of the layer. When the plate is heated above the crystallization temperature of the a-Si layer, heavy metal impurities are gettered from the single crystal.

7 Claims, 3 Drawing Figures

METHOD FOR GETTERING HEAVY METAL FROM A SILICON PLATE

This application is a continuation of application Ser. No. 649,524, filed on Sept. 11, 1984, now abandoned.

BACKGROUND OF THE INVENTION

This invention relates to methods for gettering heavy metals and, more particularly, to a new and improved method for gettering heavy metals from a single crystal silicon plate to eliminate contaminants introduced during the processing of the silicon plate and the resultant microscopic defects.

The trend toward reduction of size and increased integration in electronic devices demands large scale integration (LSI) techniques which require more complete purification of products. To improve the degree of purification of such products, production is carried out in an ideally clean environment and chemicals of high purity are used. Despite such precautions, however, contamination of the products to some extent is inevitable. It has been reported that such products suffer from various induced defects which are caused in the oxidation and diffusion stage of processing and from contamination with heavy metals in the stage of controlled orientation of crystal growth. Examples of the heavy metals responsible for the contamination include Fe, Cu, Ni, Cr, Co, and Au. The resulting defects cause various problems such as shortened life time of MOS's and decreased memory holding time of RAM's and, consequently, they strongly affect the performance and yields of the devices containing them.

This contamination with heavy metals may be diminished to a certain extent by efforts at purification but some contamination is inevitable. For the purpose of avoiding the effects of such contamination, various procedures have been tried which produce deformation of the rear surface of a silicon wafer, thereby causing the entrapped heavy metal to be attracted to the crystal defect caused by the deformation and enabling the activated region of the device to be kept in a defectless state. These are as follows:
(1) Scratches are inflicted on the rear surface of wafer by lapping or marking.
(2) Strain is introduced by exposure to a laser beam.
(3) Strain is introduced by injection of ions.
(4) A $Si_3N_4$ film is formed on the rear surface of the wafer.

The infliction of scratches on the rear surface of a wafer as by lapping in procedure (1) is disadvantageous because the treatment must be performed on each wafer separately, the lapping work consumes much time, and the treatment for cleaning the lapped wafer is complicated. The vacuum deposition by means of a laser beam in procedure (2) turns out to be an expensive operation because the entire surface of each wafer must be exposed to the laser beam. In the case of procedure (3), requiring injection of ions, control of exact doses of ions is difficult and the wafer requires complicated treatments such as heat treatment after the injection. The method of procedure (4), involving the formation of an $Si_3N_4$ film, is optimum only when the thickness of the film is 2000 Å. If the thickness exceeds 2500 Å, the film thickness must be controlled carefully because the wafer may warp or there may be slippage between the layers. Moreover, this method is not as effective as might be expected unless it is carried out in conjunction with a gettering treatment involving diffusion of phosphorus in the rear surface of the wafer. Since $Si_3N_4$ forms an insulating film on the wafer, this method inevitably requires an extra step for the removal of $Si_3N_4$.

An object of the present invention is to provide a convenient and highly effective method for gettering a heavy metal from a silicon plate which overcomes the disadvantages of the prior art.

SUMMARY OF THE INVENTION

This and other objects of the invention are accomplished by depositing a layer of amorphous silicon on one surface of a single crystal silicon plate, heating the layer of amorphous silicon to a temperature exceeding the crystallizing temperature of amorphous silicon, thereby converting the layer of amorphous silicon into a layer of polycrystalline silicon, and gettering the heavy metal by way of the layer of polycrystalline silicon.

BRIEF DESCRIPTION OF THE DRAWINGS

Further objects and advantages of the invention will be apparent from a reading of the following description of preferred embodiments in conjunction with the accompanying drawings in which.

DESCRIPTION OF PREFERRED EMBODIMENTS

Figure 1:
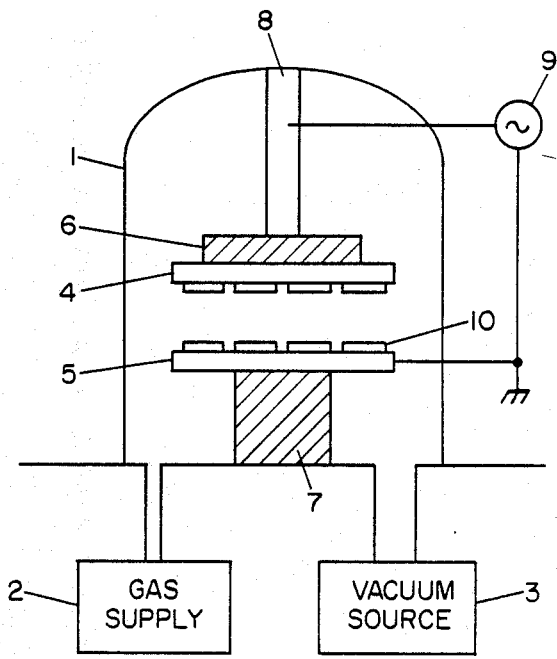
FIG. 1 is a schematic cross sectional view illustrating a typical apparatus for forming an amorphous silicon to be used in carrying out the present invention.
Figure 2:
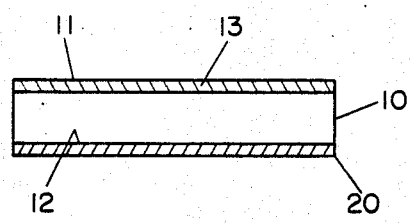
FIG. 2 is a schematic cross sectional view illustrating a representative silicon plate prepared in accordance with one embodiment of this invention.

FIG. 1 illustrates a representative apparatus for depositing amorphous silicon (hereinafter referred to as "a-Si") on a single crystal silicon plate. A vacuum vessel 1 is connected to a gas supply 2 and a vacuum source 3. Inside the vacuum vessel are two opposed electrodes 4 and 5 supported on corresponding hot plates 6 and 7, respectively, each of which incorporates a heater for applying heat to the electrode. The upper electrode 4 and the upper hot plate 6 are secured to the vacuum vessel by a support member 8. Silane gas is supplied from the gas supply 2 to the vacuum vessel 1 and the gas pressure inside the vessel is controlled in the range of 1 to 10 Torr by the vacuum source 3. A glow discharge is generated between the electrodes 4 and 5 by application of voltage from a high-frequency power source 9 so as to decompose the reaction gas and cause an a-Si layer 20 to grow on the hot single crystal silicon wafers 10 to produce a plate as illustrated in FIG. 2.

Generally, in the formation of the a-Si layer, the substrate is disposed on the grounded electrode, i.e., the electrode 5 in the case of the setup shown in FIG. 1. In this invention, because the regularity of the a-Si layer thus formed is not significant, both of the electrodes 4 and 5 may be utilized. The wafers 10 are attached with their mirror-ground surfaces 11 against the electrodes 4 and 5 and they are heated to about 200° C. so that an a-Si layer 20 is deposited on their rear surfaces 12.

When silane gas is supplied as the reaction gas, the a-Si layer deposited is in the form of non-doped a-Si. When the silane incorporates therein about 1% of diborane or phosphine, there is formed a p-type a-Si layer or an n-type a-Si layer, respectively. The a-Si layer 20 is formed with a thickness of several hundred to several thousand Angstroms (Å). To improve the adhesion of the a-Si layer to the silicon wafer, it is desirable to first form an a-Si layer on the wafer with a thickness of a few hundreds of Angstroms by a direct-current discharge and then form the rest of the a-Si layer by a high-frequency discharge.

Figure 3:
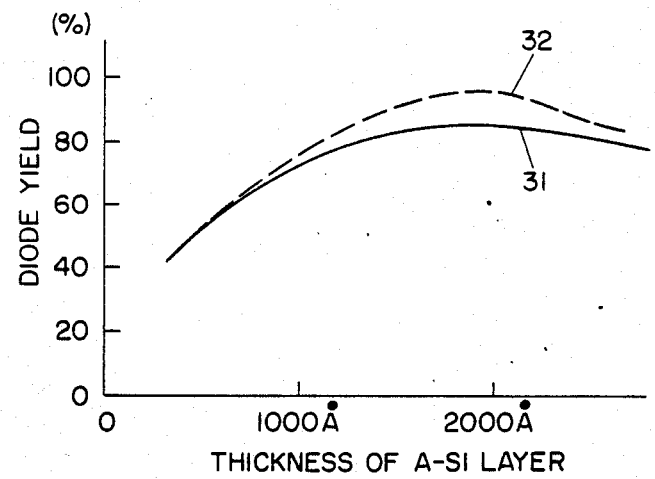
FIG. 3 is a graphical representation showing the dependency, upon the thickness of the amorphous silicon layer, of the effect of the invention as manifested in the yields of diodes of acceptable leakage current.

FIG. 3 is a graphical representation showing the dependency of the yield of diodes having a leakage current of not more than 100 mA/cm$^2$ upon the thickness of the a-Si layer, determined by forming diodes on the surface 11 side of silicon wafers 10 having such an a-Si layer 20. Wafers 10 having either a non-doped a-Si layer or an n-type a-Si layer 20 are used in forming the diodes. The wafers 10 are arranged on opposite sides of a solid source of boron ions, such as a BN plate, so that the surfaces 11 of wafers confront the solid source of boron. The wafers are then heated to about 1000° C. while nitrogen gas containing about 1000 ppm of oxygen is fed as a carrier gas at a flow rate of 4 to 6 liters/minute. After a few tens of minutes to about one hour of the heating, a p-type layer 13 is formed having a thickness of several micrometers.

The dependency of the leakage current of the diode so produced upon the thickness of the a-Si layer is shown in FIG. 3. In this graph, the curve 31 represents the data obtained with wafers formed with a non-doped a-Si layer and the curve 32 represents the data obtained with wafers formed with an n-type a-Si layer. Thus, the deposition of the a-Si layer 20 on the rear surface of the wafer 10 improves the yield of diodes produced on such wafers. This improved yield of diodes may be logically explained by postulating that, because the wafer is heated to about 1000° C., a temperature exceeding the crystallizing temperature of a-Si, the a-Si layer is transformed to a layer of polycrystalline silicon and, during this process, the heavy metal in the wafer is gettered into the layer of polycrystalline silicon. As shown in FIG. 3 the invention is somewhat more effective when an n-type a-Si layer is formed than when a non-doped a-Si layer is formed. A possible reason for this difference is that the effect of gettering is doubled by the gettering of phosphorus in the former case.

In accordance with the invention described above, there is provided a method of gettering of a heavy metal from a silicon plate by depositing an a-Si layer on the rear surface of the silicon plate, converting the a-Si layer into a layer of polycrystalline silicon, and carrying out the gettering by way of the polycrystalline silicon.

When an n-type a-Si layer is used in this method, the gettering effect with phosphorus dopant and the gettering effect with the heavy metal through the medium the layer of polycrystalline silicon are obtained simultaneously by one treatment. Further, because the temperature for the formation of the a-Si layer is about 200° C., a low temperature as compared with the temperature to which the wafer is heated in the ordinary process, and also because the growth of the layer is in the gaseous phase, the properties of the resulting device are not affected by a change in the relative occurrence of the a-Si layer formation step in the entire process of wafer production whereas in conventional treatment for the purpose of gettering, the occurrence of this treatment step with respect to other steps in the process is an important factor. In accordance with this invention, however, this treatment can be carried out at the most advantageous time without adversely affecting any other stages of the process. The improvement provided by this invention in the production of LSI's, for example, is outstanding.

We claim:

1. A method for gettering a heavy metal from a single crystal silicon plate comprising
   (a) depositing a layer of amorphous silicon of between 1000 Å and 2500 Å in thickness on one surface of a single crystal silicon plate; and
   (b) heating said layer of amorphous silicon to a temperature exceeding the crystallizing temperature of amorphous silicon, thereby converting said layer of amorphous silicon into a layer of polycrystalline silicon and gettering the heavy metal from the single crystal plate by way of the layer of polycrystalline silicon.

2. A method according to claim 1, wherein the amorphous silicon is deposited in a glow discharge at a temperature of about 200° C.

3. A method according to claim 2, wherein the conversion of amorphous silicon into polycrystalline silicon occurs as part of a conventional wafer treatment step involving heating.

4. A method according to claim 1, wherein the amorphous silicon layer contains a dopant.

5. A method according to claim 4, wherein the amorphous silicon is doped to form n-type silicon.

6. A method according to claim 5, wherein the amorphous silicon is deposited in a glow discharge at a temperature of about 200° C.

7. A method according to claim 5, wherein the amorphous silicon contains phosphorus.

* * * * *